United States Patent
Luo et al.

(10) Patent No.: US 12,317,531 B2
(45) Date of Patent: May 27, 2025

(54) SHIELDED-GATE-TRENCH MOSFET AND METHOD FOR MANUFACTURING THE SAME

(71) Applicant: CHINA RESOURCES MICROELECTRONICS (CHONGQING) CO., LTD., ChongQing (CN)

(72) Inventors: Fei Luo, ChongQing (CN); Yuling Tang, ChongQing (CN); Mingjiang He, ChongQing (CN); Jianwen Tan, ChongQing (CN)

(73) Assignee: CHINA RESOURCES MICROELECTRONICS (CHONGQING) CO., LTD., ChongQing (CN)

( * ) Notice: Subject to any disclaimer, the term of this patent is extended or adjusted under 35 U.S.C. 154(b) by 0 days.

(21) Appl. No.: 18/835,999

(22) PCT Filed: Apr. 10, 2023

(86) PCT No.: PCT/CN2023/087388
§ 371 (c)(1),
(2) Date: Aug. 5, 2024

(87) PCT Pub. No.: WO2023/231577
PCT Pub. Date: Dec. 7, 2023

(65) Prior Publication Data
US 2025/0120110 A1    Apr. 10, 2025

(30) Foreign Application Priority Data
Jun. 1, 2022  (CN) .......................... 202210631852.5

(51) Int. Cl.
*H01L 29/417*    (2006.01)
*H10D 30/01*     (2025.01)
(Continued)

(52) U.S. Cl.
CPC ..... *H10D 30/0295* (2025.01); *H10D 30/0297* (2025.01); *H10D 30/668* (2025.01);
(Continued)

(58) Field of Classification Search
None
See application file for complete search history.

(56) References Cited

U.S. PATENT DOCUMENTS

2012/0018802 A1*  1/2012  Liu .................... H10D 30/668
257/334

FOREIGN PATENT DOCUMENTS

| CN | 107887256 A | 4/2018 |
| CN | 113130633 A | 7/2021 |

(Continued)

*Primary Examiner* — Robert K Carpenter
(74) *Attorney, Agent, or Firm* — IPRTOP LLC

(57) ABSTRACT

An SGT MOSFET comprising a substrate, an epitaxial layer, a masking dielectric layer, an interlayer dielectric layer, a source lead-out contact hole, and a source conductive layer and a method for manufacturing the SGT MOSFET are provided. The epitaxial layer is on an upper surface of the substrate and comprises a cellular trench structure, a terminal lead-out structure, a source lead-out structure, a body region, and a source region. The source lead-out structure comprises a source lead-out conductive layer. The masking dielectric layer and the interlayer dielectric layer are sequentially stacked above the epitaxial layer. The source lead-out contact hole penetrates the interlayer dielectric layer and the masking dielectric layer and extends into the source lead-out conductive layer, The source conductive layer fills the source lead-out contact hole. The masking dielectric layer is formed between the interlayer dielectric layer and the epitaxial layer and masks the third dielectric layer.

15 Claims, 5 Drawing Sheets

(51) Int. Cl.
*H10D 30/66* (2025.01)
*H10D 64/00* (2025.01)
*H10D 64/01* (2025.01)
*H10D 64/23* (2025.01)

(52) U.S. Cl.
CPC .......... *H10D 64/01* (2025.01); *H10D 64/117* (2025.01); *H10D 64/2527* (2025.01)

(56) References Cited

FOREIGN PATENT DOCUMENTS

| | | |
|---|---|---|
| KR | 20040008507 A | 1/2004 |
| KR | 20040009788 A | 1/2004 |

\* cited by examiner

SHIELDED-GATE-TRENCH MOSFET AND METHOD FOR MANUFACTURING THE SAME

FIELD OF THE INVENTION

The present disclosure belongs to the technical field of semiconductors, and relates to a shielded-gate-trench (SGT) metal-oxide-semiconductor field-effect transistor (MOSFET) and a method for manufacturing the same.

BACKGROUND OF THE INVENTION

SGT-MOSFETs used in low-and-medium-voltage power MOSFETs offer several advantages over traditional trench MOSFETs. These benefits include lower on-resistance and faster switching speeds, resulting in reduced conduction and switching losses. As a result, systems using SGT MOSFETs achieve higher conversion and transmission efficiency.

For low-voltage SGT MOSFETs (typically up to 60V), there's a demand for small critical dimensions (CD) and small cellular unit sizes (pitch). However, in some current power device production, photolithography machines have a minimum exposure size of approximately 0.2-0.25 μm, with an alignment accuracy of 70 nm. Additionally, during wafer manufacturing, wafer warpage can lead to shifts of the contact hole at the wafer's edge during etching. The schematic cross-sectional structure shown in FIG. 1 illustrates the shifted position of the source lead-out contact hole. It includes a substrate 01, an epitaxial layer 02, a cellular trench structure 021, a first trench 0211, a first shield gate layer 0212, a first dielectric layer 0213, a first isolation dielectric layer 0214, a gate dielectric layer 0215, a first gate conductive layer 0216, a terminal lead-out structure 022, a second trench 0221, a second shield gate layer 0222, a second dielectric layer 0223, a second isolation dielectric layer 0224, a second gate conductive layer 0225, a source lead-out structure 023, a third trench 0231, a third dielectric layer 0232, a source lead-out conductive layer 0233, an interlayer dielectric layer 03, a source contact hole 031, a terminal lead-out contact hole 032, a source lead-out contact hole 033, and a photoresist layer 04. The shifts of the source lead-out contact hole can damage the sidewall oxide layer of the trench, leading to the formation of a tungsten wedge in the contact hole. Under electrical bias, this can create a localized current concentration, introducing operational risks.

Therefore, there is an urgent need to develop a method for manufacturing an SGT MOSFET that prevents source lead-out contact hole shifts at the wafer's edge and avoids the formation of wedge-shaped conductive pillars filling contact holes.

SUMMARY OF THE INVENTION

In view of the above-mentioned shortcomings, the present disclosure provides a shielded-gate-trench (SGT) MOSFET and a method for manufacturing the same, which aim to prevent source lead-out contact hole shifts at the wafer's edge and avoid the formation of wedge-shaped conductive pillars filling contact holes.

The method for manufacturing the SGT MOSFET comprises providing a substrate, and forming an epitaxial layer on an upper surface of the substrate, and the substrate and the epitaxial layer are of a first doping type; forming a cellular trench structure, a terminal lead-out structure, a source lead-out structure, a body region, and a source region in the epitaxial layer, the body region is of a second doping type, and the source region is of the first doping type; the source lead-out structure comprises a source lead-out conductive layer, the body region is disposed in upper surface layers of the epitaxial layer between two adjacent cellular trench structures and between the cellular trench structure and the terminal lead-out structure, and the source region is disposed on an upper surface layer of the body region; forming a masking dielectric layer disposed above the epitaxial layer and an interlayer dielectric layer covering an upper surface of the masking dielectric layer, and planarizing an upper surface of the interlayer dielectric layer; forming a source lead-out contact hole penetrating the interlayer dielectric layer and the masking dielectric layer, and a bottom of the source lead-out contact hole extends into the source lead-out conductive layer; forming a source conductive layer on the upper surface of the interlayer dielectric layer, and the source conductive layer also fills the source lead-out contact hole.

Optionally, the cellular trench structure comprises a first trench, a first shield gate layer, a first dielectric layer, a first isolation dielectric layer, a gate dielectric layer, and a first gate conductive layer, the first shield gate layer fills a lower portion of the first trench, the first dielectric layer wraps a bottom surface and a side wall of the first shield gate layer and is disposed on an inner wall of the first trench, the first isolation dielectric layer covers upper surfaces of the first shield gate layer and the first dielectric layer, the gate dielectric layer is disposed on the inner wall of the first trench and covers an upper surface of the first isolation dielectric layer, and the first gate conductive layer fills an upper portion of the first trench; the terminal lead-out structure comprises a second trench, a second shield gate layer, a second dielectric layer, a second isolation dielectric layer, the gate dielectric layer, and a second gate conductive layer, the second shield gate layer fills a lower portion of the second trench, the second dielectric layer wraps a bottom surface and a side wall of the second shield gate layer and is disposed on an inner wall of the second trench, the second isolation dielectric layer covers upper surfaces of the second shield gate layer and the second dielectric layer, the gate dielectric layer is disposed on the inner wall of the second trench and covers an upper surface of the second isolation dielectric layer, and the second gate conductive layer fills an upper portion of the second trench; the source lead-out structure comprises a third trench and a third dielectric layer, the third dielectric layer is disposed on an inner wall of the third trench, the source lead-out conductive layer fills the third trench, and the gate dielectric layer also covers an upper surface of the epitaxial layer.

Optionally, the first isolation dielectric layer and the second isolation dielectric layer are formed by: forming an isolation dielectric material layer on the upper surface of the epitaxial layer, the isolation dielectric material layer fills the first trench and the second trench, and planarizing an upper surface of the isolation dielectric material layer; forming an opening part with a first preset depth by patterning the isolation dielectric material layer, a bottom surface of the opening part is lower than the upper surface of the epitaxial layer; removing the isolation dielectric material layer on the upper surface of the epitaxial layer, and deepening a bottom of the opening part to a second preset depth to obtain the first isolation dielectric layer and the second isolation dielectric layer, an opening size of the opening part is the same as an opening size of the first trench.

Optionally, a source contact hole and a terminal lead-out contact hole are further formed at the same time as the source lead-out contact hole, the source contact hole penetrates the interlayer dielectric layer and the masking dielectric layer and extends into the body region, and the terminal lead-out contact hole penetrates the interlayer dielectric layer and the masking dielectric layer and extends into the second gate conductive layer.

Optionally, a material of the third dielectric layer is different from a material of the masking dielectric layer.

Optionally, a material of the masking dielectric layer comprises silicon nitride.

Optionally, the planarizing of the interlayer dielectric layer adopts chemical mechanical polishing.

Optionally, the source lead-out contact hole is formed by dry etching.

Optionally, the forming of the source lead-out contact hole comprises a first etching stage, a second etching stage, and a third etching stage, the interlayer dielectric layer is etched during the first etching stage under a first etching condition until the masking dielectric layer is exposed, the masking dielectric layer is etched during the second etching stage under a second etching condition until the source lead-out conductive layer is exposed, and the source lead-out conductive layer is etched during the third etching stage under a third etching condition.

The SGT MOSFET comprises: a substrate of a first doping type; an epitaxial layer disposed on an upper surface of the substrate, the epitaxial layer comprises a cellular trench structure, a terminal lead-out structure, a source lead-out structure, a body region, and a source region, the epitaxial layer and the source region are of the first doping type, and the body region is of a second doping type; the source lead-out structure comprises a source lead-out conductive layer, the body region is disposed in upper surface layers of the epitaxial layer between two adjacent cellular trench structures and between the cellular trench structure and the terminal lead-out structure, and the source region is disposed on an upper surface layer of the body region; a masking dielectric layer disposed above the epitaxial layer; an interlayer dielectric layer, planarized and disposed on an upper surface of the masking dielectric layer; a source lead-out contact hole, penetrating the interlayer dielectric layer and the masking dielectric layer and extending into the source lead-out conductive layer; and a source conductive layer, disposed on an upper surface of the interlayer dielectric layer and filled into the source lead-out contact hole.

The SGT MOSFET and its manufacturing method described earlier involve several steps. First, the cellular trench structure, the terminal lead-out structure, and the source lead-out structure are formed. Then, the masking dielectric layer is formed on the upper surface of the epitaxial layer. Next, the interlayer dielectric layer is formed on the upper surface of the masking dielectric layer. During the etching process for the source lead-out contact hole, the etching selectivity ratio between the masking dielectric layer and the third dielectric layer is high. Importantly, the opening size of the masking dielectric layer remains constant during the etching of the source lead-out conductive layer. The masking dielectric layer is configured to mask the third dielectric layer to prevent the bottom of the contact hole from enlarging, which could otherwise damage the third dielectric layer and affect device stability. Afterward, the upper surface of the interlayer dielectric layer is planarized to minimize damage caused by positional shifts during exposure when forming the source lead-out contact hole, ensuring a sufficient contact area between the source conductive layer and the source lead-out conductive layer, preventing wedge formation and current concentration. This method ensures device stability and maintains a high yield for contact holes, without requiring complex processes or highly precise equipment, thereby holding significant value for industrial applications.

REFERENCE NUMERALS

Figure 1:
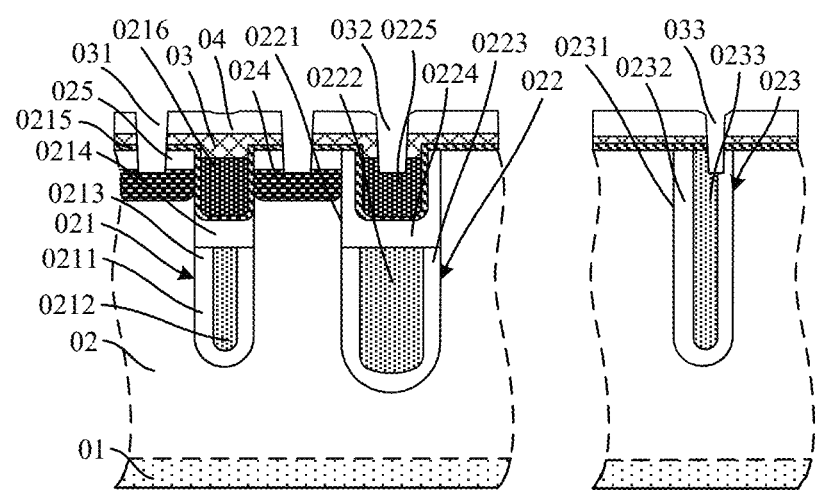
FIG. 1 shows a schematic cross-sectional diagram showing a shifted position of a source lead-out contact hole formed by a method for manufacturing an SGT MOSFET.

01 Substrate
02 Epitaxial layer
021 Cellular trench structure
0211 First trench
0212 First shield gate layer
0213 First dielectric layer
0214 First isolation dielectric layer
0215 Gate dielectric layer
0216 First gate conductive layer
022 Terminal lead-out structure
0221 Second trench
0222 Second shield gate layer
0223 Second dielectric layer
0224 Second isolation dielectric layer
0225 Second gate conductive layer 023 Source lead-out structure
0231 Third Trench
0232 Third dielectric layer
0233 Source lead-out conductive layer
03 Interlayer dielectric layer
031 Source contact hole
032 Terminal lead-out contact hole
033 Source lead-out contact hole
04 Photoresist layer
1 Substrate
2 Epitaxial layer
21 Cellular trench structure
211 First trench
212 First shield gate layer
213 First dielectric layer
214 First isolation dielectric layer
215 Gate dielectric layer
216 First gate conductive layer
217 Dielectric material layer
218 First conductive material layer
219 Second photoresist layer
22 Terminal lead-out structure
221 Second trench
222 Second shield gate layer
223 Second dielectric layer
224 Second isolation dielectric layer
225 Second gate conductive layer
226 Isolation dielectric material layer
227 Second conductive material layer
228 Second masking layer
23 Source lead-out structure
231 Third Trench
232 Third dielectric layer
233 Source lead-out conductive layer
3 Masking dielectric layer
4 Interlayer dielectric layer
41 Source contact hole
42 Terminal lead-out contact hole
43 Source lead-out contact hole
44 Third photoresist layer
5 Source conductive layer
6 Drain conductive layer

DETAILED DESCRIPTION OF THE INVENTION

The embodiments of the present disclosure will be described below. Those skilled can easily understand disclosure advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Refer to FIGS. 2 to 11. It should be noted that the drawings provided in this disclosure only illustrate the basic concept of the present disclosure in a schematic way, so the drawings only show the components closely related to the present disclosure. The drawings are not necessarily drawn according to the number, shape, and size of the components in actual implementation; during the actual implementation, the type, quantity and proportion of each component can be adjusted as needed, and the components' layout may also be more complicated.

Embodiment 1

Figure 2:
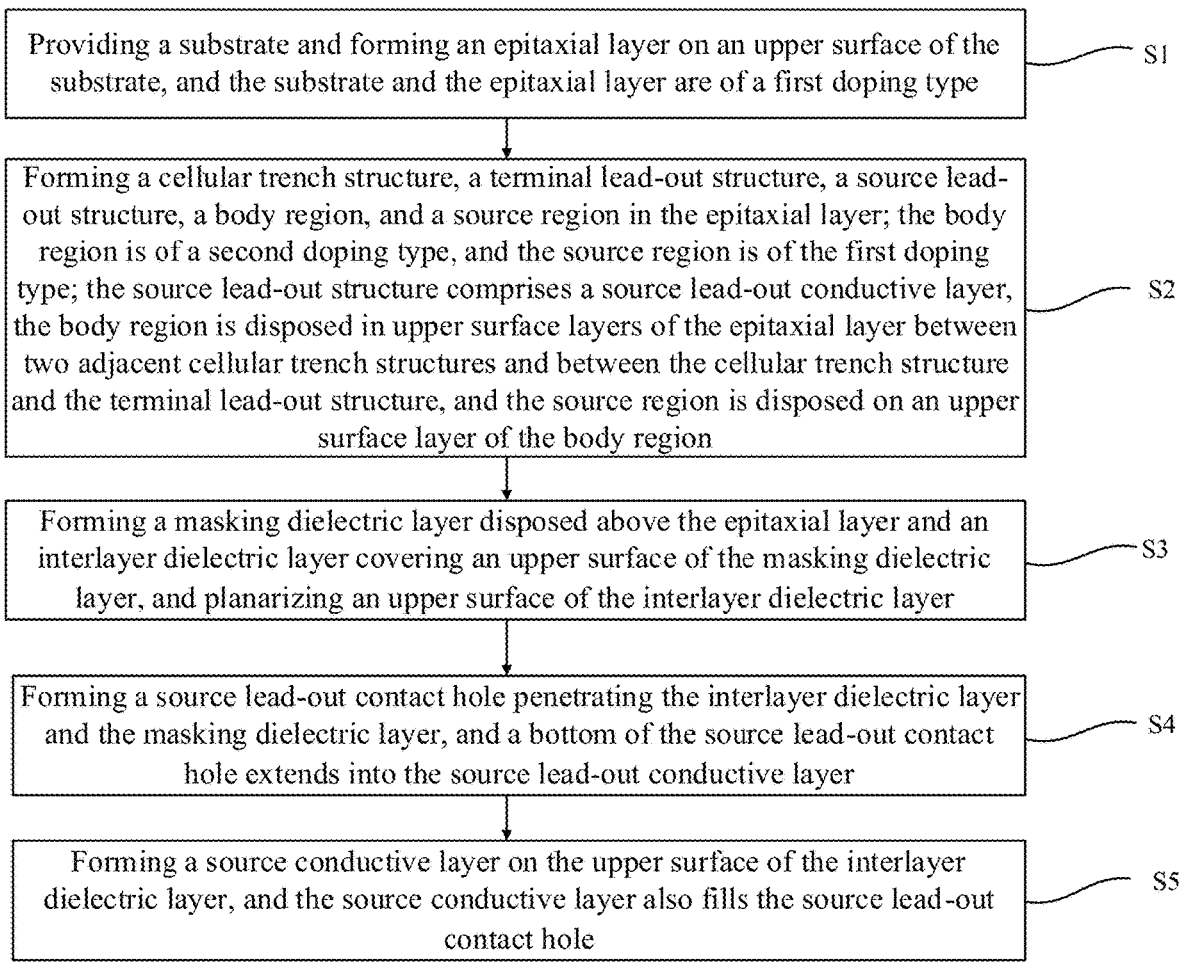
FIG. 2 shows a flow chart of a method for manufacturing an SGT MOSFET according to the present disclosure.

Embodiment 1 provides a method for manufacturing an SGT MOSFET. FIG. 2 shows a flow chart of the method for manufacturing the SGT MOSFET, which comprises steps S1-S5.

S1 includes providing a substrate, and forming an epitaxial layer on an upper surface of the substrate; the substrate and the epitaxial layer are of a first doping type.

S2 includes forming a cellular trench structure, a terminal lead-out structure, a source lead-out structure, a body region, and a source region in the epitaxial layer; the body region is of a second doping type, and the source region is of the first doping type; the source lead-out structure comprises a source lead-out conductive layer, the body region is disposed in upper surface layers of the epitaxial layer between two adjacent cellular trench structures and between the cellular trench structure and the terminal lead-out structure, and the source region is disposed on an upper surface layer of the body region.

S3 includes forming a masking dielectric layer disposed above the epitaxial layer and an interlayer dielectric layer covering an upper surface of the masking dielectric layer, and planarizing an upper surface of the interlayer dielectric layer.

S4 includes forming a source lead-out contact hole penetrating the interlayer dielectric layer and the masking dielectric layer, and a bottom of the source lead-out contact hole extends into the source lead-out conductive layer.

S5 includes forming a source conductive layer on the upper surface of the interlayer dielectric layer, and the source conductive layer also fills the source lead-out contact hole.

FIGS. 3 to 8 show processes of steps S1 and S2. S1 includes providing a substrate 1, and forming an epitaxial layer 2 on an upper surface of the substrate 1, and the substrate 1 and the epitaxial layer 2 are of a first doping type. S2 includes forming a cellular trench structure 21, a terminal lead-out structure 22, a source lead-out structure 23, a body region 24, and a source region 25 in the epitaxial layer 2, and the body region 24 is of a second doping type, and the source region 25 is of the first doping type; the source lead-out structure 23 comprises a source lead-out conductive layer 233, the body region 24 is disposed in upper surface layers of the epitaxial layer between two adjacent cellular trench structures 21 and between the cellular trench structure 21 and the terminal lead-out structure 22, and the source region 25 is disposed on an upper surface layer of the body region 24.

Specifically, the first doping type is one of N-type and P-type, and the second doping type is the other one of N-type and P-type, that is, the first doping type and the second doping type are different. In Embodiment 1, the first doping type is N-type, and the second doping type is P-type.

As an example, a material of the substrate 1 comprises silicon or other suitable material. In Embodiment 1, the substrate 1 is made of silicon.

As an example, the method of forming the epitaxial layer 2 comprises chemical vapor deposition, physical vapor deposition, or any other suitable method.

As an example, doping concentrations of the substrate 1 and the epitaxial layer 2 can be selected according to actual applications. In Embodiment 1, the doping concentration of the substrate 1 is higher than the doping concentration of the epitaxial layer 2.

As an example, the cellular trench structure 21 comprises a first trench 211, a first shield gate layer 212, a first dielectric layer 213, a first isolation dielectric layer 214, a gate dielectric layer 215, and a first gate conductive layer 216. The first shield gate layer 212 fills a lower portion of the first trench 211, the first dielectric layer 213 wraps a bottom surface and a side wall of the first shield gate layer 212 and is disposed on an inner wall of the first trench 211, the first isolation dielectric layer 214 covers upper surfaces of the first shield gate layer 212 and the first dielectric layer 213, the gate dielectric layer 215 is disposed on the inner wall of the first trench 211 and covers an upper surface of the first isolation dielectric layer 214, and the first gate conductive layer 216 fills an upper portion of the first trench 211. The terminal lead-out structure 22 comprises a second trench 221, a second shield gate layer 222, a second dielectric layer 223, a second isolation dielectric layer 224, the gate dielectric layer 215, and a second gate conductive layer 225. The second shield gate layer 222 fills a lower portion of the second trench 221, the second dielectric layer 223 wraps a bottom surface and a side wall of the second shield gate layer 222 and is disposed on an inner wall of the second trench 221, the second isolation dielectric layer 224 covers upper surfaces of the second shield gate layer 222 and the second dielectric layer 223, the gate dielectric layer 215 is disposed on the inner wall of the second trench 221 and covers an upper surface of the second isolation dielectric layer 224, and the second gate conductive layer 225 fills an upper portion of the second trench 221. The source lead-out structure 23 comprises a third trench 231 and a third dielectric layer 232. The third dielectric layer 232 is disposed on an inner wall of the third trench 231, the source lead-out conductive layer 233 fills the third trench 231, and the gate dielectric layer 215 also covers an upper surface of the epitaxial layer 2.

Figure 3:
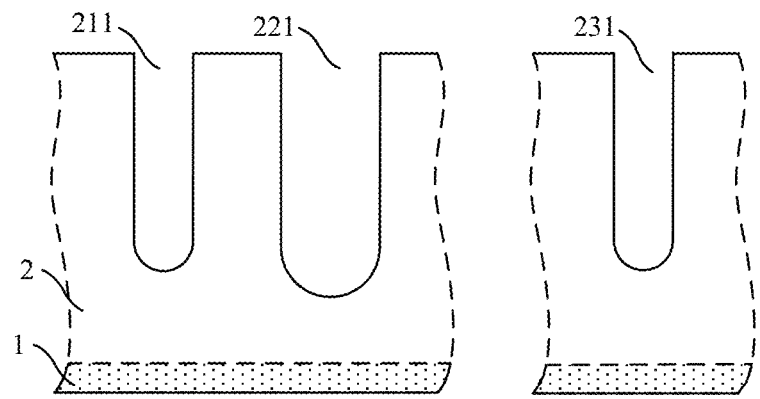
FIG. 3 shows a schematic cross-sectional diagram of an intermediate structure obtained after forming a first trench, a second trench, and a third trench by the method for manufacturing the SGT MOSFET according to the present disclosure.

FIG. 3 shows a schematic cross-sectional diagram of an intermediate structure obtained after forming the first trench 211, the second trench 221, and the third trench 231. Specifically, the first trench 211, the second trench 221, and the third trench 231 are formed by: forming a first photoresist layer (not shown) on the upper surface of the epitaxial layer 2, and patterning the first photoresist layer to obtain a patterned first photoresist layer; and forming the first trench 211, the second trench 221, and the third trench 231 based on the patterned first photoresist layer.

As an example, the method of forming the first trench 211, the second trench 221, and the third trench 231 comprises dry etching, wet etching, or any other suitable method. In Embodiment 1, all of the first trench 211, the second trench 221, and the third trench 231 are formed by dry etching.

As an example, an opening size of each of the first trench 211, the second trench 221, and the third trench 231 can be determined based on actual applications. In Embodiment 1, the opening size of the first trench 211 is smaller than the opening size of the second trench 221.

Figure 4:
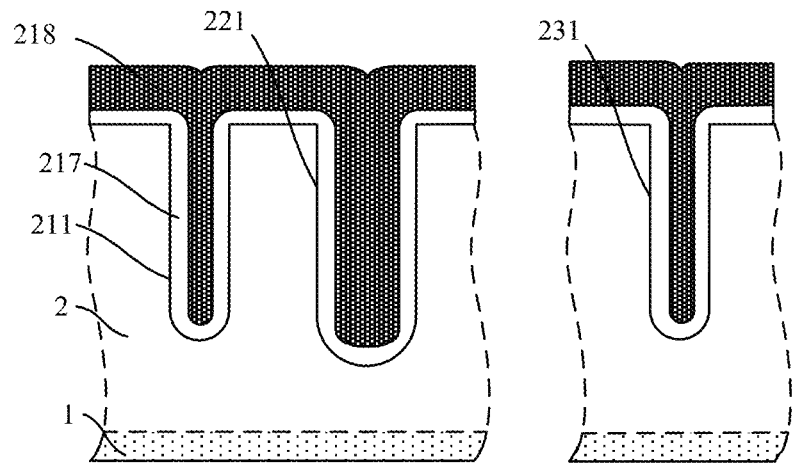
FIG. 4 shows a schematic cross-sectional diagram of an intermediate structure obtained after forming a first conductive material layer by the method for manufacturing the SGT MOSFET according to the present disclosure.

FIG. 4 shows a schematic cross-sectional diagram of an intermediate structure obtained after forming a dielectric material layer 217 and a first conductive material layer 218. Specifically, the first shield gate layer 212 and the second shield gate layer 222 are formed further by: forming the dielectric material layer 217 on the inner walls of the first trench 211, the second trench 221, and the third trench 231 and the upper surface of the epitaxial layer 2; forming the first conductive material layer 218 covering an upper surface of the dielectric material layer 217 and filling the first trench 211, the second trench 221, and the third trench 231; removing the dielectric material layer 217 and the first conductive material layer 218 on the upper surface of the epitaxial layer 2 to obtain the source lead-out conductive layer 233 and the third dielectric layer 232, and forming a second photoresist layer 219 on the upper surface of the epitaxial layer 2; patterning the second photoresist layer 219 such that the second photoresist layer 219 masks an opening surface of the third trench 231, and etching the first conductive material layer 218 in the first trench 211 and the second trench 221 to a preset depth to obtain the first shield gate layer 212 and the second shield gate layer 222.

As an example, the method of forming the dielectric material layer 217 comprises chemical vapor deposition, physical vapor deposition, thermal oxidation, or any other suitable method.

As an example, a thickness of the dielectric material layer 217 can be determined based on actual applications as long as the device has a sufficient voltage resistance.

As an example, a material of the dielectric material layer 217 comprises silicon oxide, silicon nitride, or any other suitable dielectric material.

As an example, the method of forming the first conductive material layer 218 comprises chemical vapor deposition, physical vapor deposition, or any other suitable method.

As an example, a material of the first conductive material layer 218 comprises polysilicon or any other suitable conductive material. In Embodiment 1, the first conductive material layer 218 is made of polysilicon material.

Figure 5:
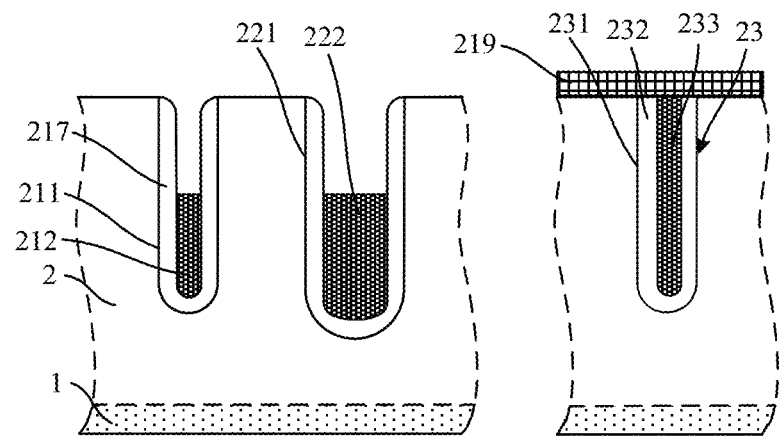
FIG. 5 shows a schematic cross-sectional diagram of an intermediate structure obtained after forming a first shield gate layer and a second shield gate layer by the method for manufacturing the SGT MOSFET according to the present disclosure.

FIG. 5 shows a schematic cross-sectional diagram of an intermediate structure obtained after forming a first shield gate layer 212 and a second shield gate layer 222. Specifically, the method of removing the dielectric material layer 217 and the first conductive material layer 218 on the upper surface of the epitaxial layer 2 comprises chemical mechanical polishing or any other suitable method. In Embodiment 1, the dielectric material layer 217 and the first conductive material layer 218 on the upper surface of the epitaxial layer 2 are synchronously removed by using chemical mechanical polishing.

As an example, the method of forming the first shield gate layer 212 and the second shield gate layer 222 comprises dry etching, wet etching, or any other suitable method.

Specifically, the dielectric material layer 217 formed on the inner walls of the first trench 211 and the second trench 221 can be synchronously removed while the first conductive material layer 218 in the first trench 211 and the second trench 221 is removed, to obtain the first dielectric layer 213 and the second dielectric layer 223, such that an upper surface of the first shield gate layer 212 is flush with an upper surface of the first dielectric layer 213, an upper surface of the second shield gate layer 222 is flush with an upper surface of the second dielectric layer 223. Alternatively, only the first conductive material layer 218 in the first trench 211 and the second trench 221 is removed is removed. In Embodiment 1, the dielectric material layer 217 and the first conductive material layer 218 in the first trench 211 and the second trench 221 are synchronously removed.

As an example, a thickness of the first shield gate layer 212 formed in the first trench 211 can be adjusted based on actual applications. Similarly, a thickness of the second shield gate layer 222 formed in the second trench 221 can also be adjusted based on actual applications. In Embodiment 1, the thickness of the first shield gate layer 212 is the same as the thickness of the second shield gate layer 222.

Specifically, after the first shield gate layer 212 and the second shield gate layer 222 are formed, the second photoresist layer 219 is removed.

After the second photoresist layer 219 is removed, the first isolation dielectric layer 214 and the second isolation dielectric layer 224 are formed.

Specifically, the first isolation dielectric layer 214 and the second isolation dielectric layer 224 are synchronously formed.

Figure 6:
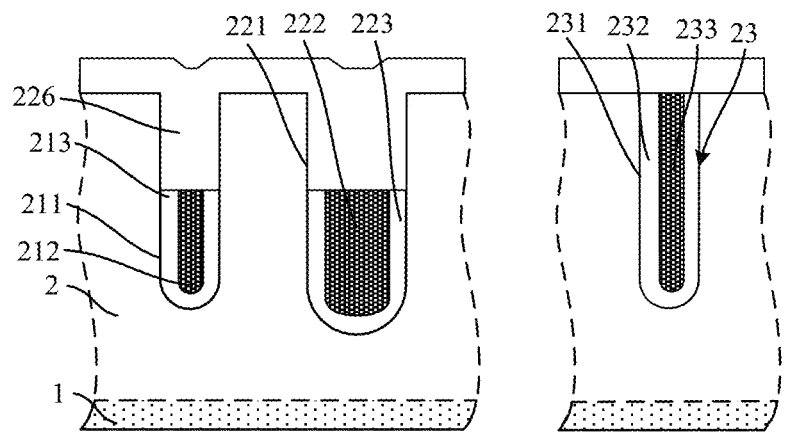
FIG. 6 shows a schematic cross-sectional diagram of an intermediate structure obtained after forming an isolation dielectric material layer by the method for manufacturing the SGT MOSFET according to the present disclosure.

FIG. 6 shows a schematic cross-sectional diagram of an intermediate structure obtained after forming an isolation dielectric material layer 226. As an example, the first isolation dielectric layer 214 and the second isolation dielectric layer 224 are formed by: forming the isolation dielectric material layer 226 on the upper surface of the epitaxial layer 226, where the isolation dielectric material layer 226 fills the first trench 211 and the second trench 221, and planarizing an upper surface of the isolation dielectric material layer 226; forming an opening part (not shown) with a first preset depth by patterning the isolation dielectric material layer 226, and a bottom surface of the opening part is lower than the upper surface of the epitaxial layer 2; removing the isolation dielectric material layer 226 on the upper surface of the epitaxial layer 2, and deepening a bottom of the opening part to a second preset depth to obtain the first isolation dielectric layer 214 and the second isolation dielectric layer 224, and an opening size of the opening part is the same as the opening size of the first trench 211.

As an example, the method of forming the isolation dielectric material layer 226 comprises high-density plasma chemical vapor deposition or any other suitable method.

Specifically, after planarizing the isolation dielectric material layer 226 and before forming the opening part with the first preset depth, a window is formed on the upper surface of the isolation dielectric material layer 226, and the opening part is then formed based on the window.

As an example, the method of planarizing the isolation dielectric material layer 226 comprises chemical mechanical polishing or any other suitable method. As an example, the method of forming the window comprises dry etching or any other suitable method. As an example, the method of forming the opening part with the first preset depth comprises dry etching or any other suitable method.

Specifically, after removing the isolation dielectric material layer 226 on the upper surface of the epitaxial layer 2 and before forming the first isolation dielectric layer 214 and the second isolation dielectric layer 224, a first masking layer covering an opening of the third trench 231 is formed.

As an example, the method of removing the isolation dielectric material layer 226 comprises chemical mechanical polishing or any other suitable method. As an example, the method of deepening the bottom of the opening part comprises wet etching or any other suitable method.

Specifically, the opening size of the opening part is the same as the opening size of the first trench 211, so that the isolation dielectric material layer 226 on a side wall of the first trench 211 can be completely etched away.

Specifically, the second isolation dielectric layer 224 formed in the second trench 221 comprises two parts: one is the isolation dielectric material layer 226 with a remaining thickness on the side wall of the second trench 221, and the other is the isolation dielectric material layer 226 covering the second dielectric layer 223 and the second trench 221.

Specifically, after the first isolation dielectric layer 214 and the second isolation dielectric layer 224 are formed, the first masking layer and the gate dielectric layer 215 covering the upper surface of the epitaxial layer 2 are further removed. The gate dielectric layer 215 further covers the inner wall of the first trench 211, an exposed surface of the first isolation dielectric layer 214, an exposed surface of the second isolation dielectric layer 224, the upper surface of the epitaxial layer 2, and an upper surface of the source lead-out structure 23. As an example, the method of forming the gate dielectric layer 215 comprises chemical vapor deposition, physical vapor deposition, thermal oxidation, or any other suitable methods.

As an example, a thickness of the first isolation dielectric layer 214 formed in the first trench 211 can be adjusted based on actual applications as long as the final device is safe for operations. Similarly, a thickness of the second isolation dielectric layer 224 formed in the second trench 221 can also be adjusted based on actual applications.

Specifically, after forming the gate dielectric layer 215 and before forming a masking dielectric layer 3, the first gate conductive layer 216 and the second gate conductive layer 225 are formed.

Figure 7:
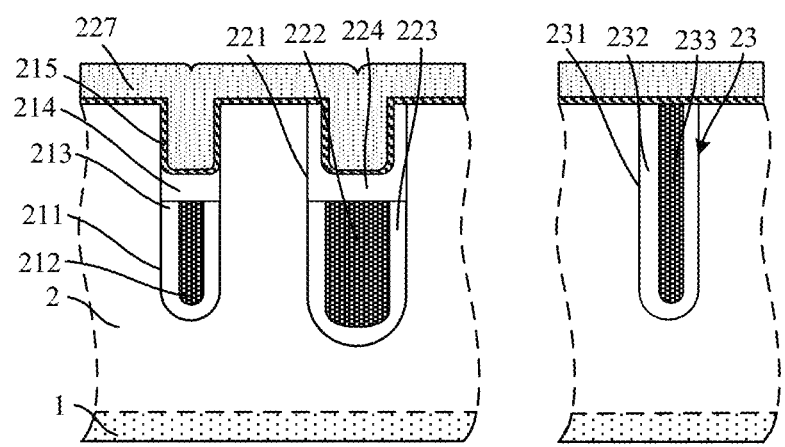
FIG. 7 shows a schematic cross-sectional diagram of an intermediate structure obtained after forming a second conductive material layer by the method for manufacturing the SGT MOSFET according to the present disclosure.

FIG. 7 shows a schematic cross-sectional diagram of an intermediate structure obtained after forming a second conductive material layer 227. Specifically, the first gate conductive layer 216 and the second gate conductive layer 225 are formed by: forming the second conductive material layer 227 on an upper surface of the gate dielectric layer 215 to cover the upper surface of the gate dielectric layer 215, where the second conductive material layer 227 fills the first trench 211 and the second trench 221, and removing the second conductive material layer 227 on the upper surface of the gate dielectric layer 215; forming a patterned second masking layer 228 on the upper surface of the gate dielectric layer 215, and etching the second conductive material layer 227 based on the patterned second masking layer 228 to obtain the first gate conductive layer 216 and the second gate conductive layer 225, and upper surfaces of the first gate conductive layer 216 and the second gate conductive layer 225 are both lower than the upper surface of the epitaxial layer 2.

Specifically, the second masking layer 228 covers the upper surfaces of the epitaxial layer 2 and the source lead-out structure 23, and the second masking layer 228 exposes an upper surface of the terminal lead-out structure 22, the upper surface of the epitaxial layer 2 between the terminal lead-out structure 22 and the cellular trench structure 21, the upper surface of the epitaxial layer 2 between two adjacent cellular trench structures 21, and an upper surface of the cellular trench structure 21.

As an example, the method of forming the second conductive material layer 227 comprises chemical vapor deposition, physical vapor deposition, or any other suitable method. As an example, the method of removing the second conductive material layer 227 on the upper surface of the gate dielectric layer 215 comprises chemical mechanical polishing, dry etching, wet etching, or any other suitable method. As an example, the method of removing the second conductive material layer 227 in the first trench 211 and the second trench 221 comprises dry etching, wet etching, or any other suitable method.

Specifically, after forming the first gate conductive layer 216 and the second gate conductive layer 225 and before forming the masking dielectric layer, the body region 24 and the source region 25 are sequentially formed. The body region 24 is disposed on the upper surfaces of the epitaxial layer 2 between two adjacent cellular trench structures 21, and between the cellular trench structure 21 and the terminal lead-out structure 22, and the source region 25 is disposed on the upper surface layer of the body region 24.

Figure 8:
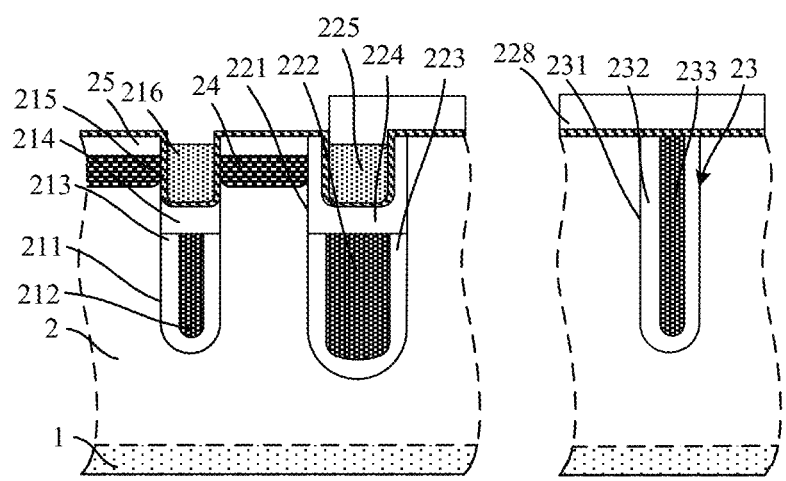
FIG. 8 shows a schematic cross-sectional diagram of an intermediate structure obtained after forming a source region by the method for manufacturing the SGT MOSFET according to the present disclosure.

FIG. 8 shows a schematic cross-sectional diagram of an intermediate structure obtained after forming the source region 25. As an example, the method of forming the body region 24 comprises ion implantation or any other suitable method. Similarly, the method of forming the source region 25 also comprises ion implantation or any other suitable method. In Embodiment 1, when forming the body region 24 and the source region 25, the cellular trench structure 21, the terminal lead-out structure 22, and the second masking layer 228 are used as mask layers, and an ion implantation of the second doping type and an ion implantation of the first doping type are sequentially performed on the epitaxial layer 2 to obtain the body region 24 and the source region 25 disposed on the upper surface layer of the body region 24.

Specifically, after forming the source region 25, the second masking layer 228 is removed.

Figure 9:
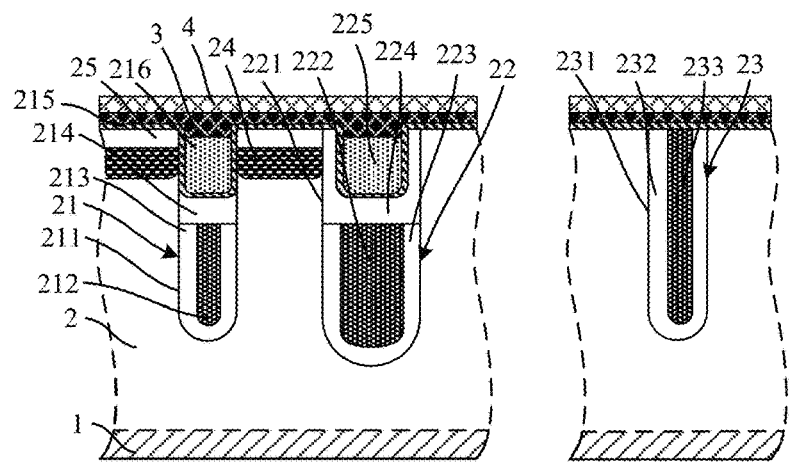
FIG. 9 shows a schematic cross-sectional diagram of an intermediate structure obtained after forming an interlayer dielectric layer by the method for manufacturing the SGT MOSFET according to the present disclosure.
Figure 10:
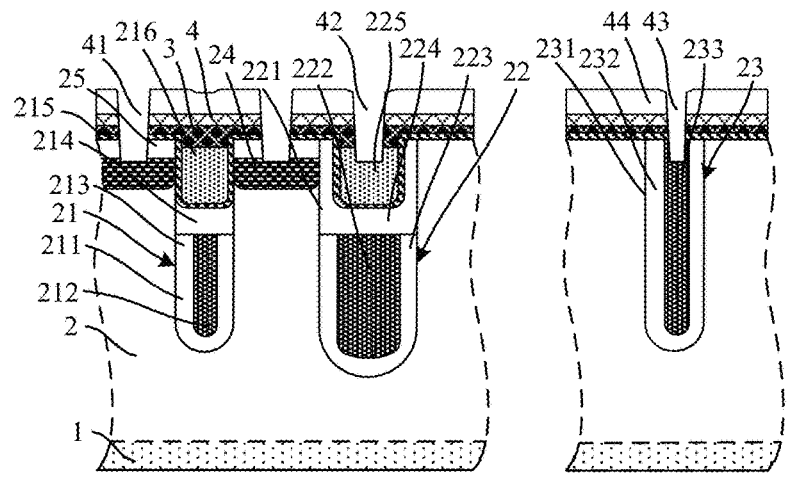
FIG. 10 shows a schematic cross-sectional diagram of an intermediate structure obtained after forming a source contact hole, a terminal lead-out contact hole, and a source lead-out contact hole by the method for manufacturing the SGT MOSFET according to the present disclosure.

FIGS. 9 to 10 show processes of steps S3 and S4. S3 includes forming the masking dielectric layer 3 disposed above the epitaxial layer 2 and then forming the interlayer dielectric layer 4 covering an upper surface of the masking dielectric layer 3, and planarizing an upper surface of the interlayer dielectric layer 4; S4 includes forming a source lead-out contact hole 43 penetrating the interlayer dielectric layer 4 and the masking dielectric layer 3, wherein a bottom of the source lead-out contact hole 43 extends into the source lead-out conductive layer 233. As an example, the masking dielectric layer 3 covers the upper surfaces of the first gate conductive layer 216 and the second gate conductive layer 225, that is, the masking dielectric layer 3 fills the first trench 211 and the second trench 221.

As an example, a material of the interlayer dielectric layer 4 is different from a material of the masking dielectric layer 3.

As an example, the material of the masking dielectric layer 3 comprises silicon nitride or any other suitable high dielectric material.

As an example, the material of the interlayer dielectric layer 4 comprises silicon oxide or any other suitable high dielectric material.

FIG. 9 shows a schematic cross-sectional diagram of an intermediate structure obtained after forming the interlayer dielectric layer 4. As an example, the method of forming the masking dielectric layer 3 comprises chemical vapor deposition, physical vapor deposition, or any other suitable method. Similarly, the method of forming the interlayer dielectric layer 4 also comprises chemical vapor deposition, physical vapor deposition, or any other suitable method.

As an example, the method of planarizing the interlayer dielectric layer 4 comprises chemical mechanical polishing or any other suitable method.

As an example, a source contact hole 41 and a terminal lead-out contact hole 42 are further formed at the same time as the source lead-out contact hole 43, the source contact hole 41 penetrates the interlayer dielectric layer 4 and the masking dielectric layer 3 and extends into the body region 24, and the terminal lead-out contact hole 42 penetrates the interlayer dielectric layer 4 and the masking dielectric layer 3 and extends into the second gate conductive layer 225.

Specifically, before forming the source lead-out contact hole 43, the upper surface of the interlayer dielectric layer 4 is planarized to avoid any shift caused by the uneven surface of the interlayer dielectric layer 4 during photolithography exposure. As a result, it minimizes damage to the third dielectric layer 232 due to shifts of the contact hole during the formation of the source lead-out contact hole 43. Additionally, it avoids forming sharp wedges due to insufficient contact area between the source lead-out conductive layer 233 and a source conductive layer 5 filling the source lead-out contact hole 43, which could lead to current concentration during conduction, potentially affecting the device's reliability.

Specifically, after planarizing the interlayer dielectric layer 4 and before forming the source contact hole 41, the terminal lead-out contact hole 42 and the source lead-out contact hole 43, a third photoresist layer 44 is formed to cover the upper surface of the interlayer dielectric layer 4, and the third photoresist layer 44 is patterned.

FIG. 10 shows a schematic cross-sectional diagram of an intermediate structure obtained after forming the source contact hole 41, the terminal lead-out contact hole 42, and the source lead-out contact hole 43. Specifically, the interlayer dielectric layer 4 and the masking dielectric layer 3 are sequentially etched based on the patterned third photoresist layer 44, and the source region 25, the second gate conductive layer 225, and the source lead-out conductive layer 233 are etched after the masking dielectric layer 3 is etched to obtain the source contact hole 41, the terminal lead-out contact hole 42, and the source lead-out contact hole 43.

As an example, the method of forming the source lead-out contact hole 43 comprises dry etching or any other suitable method.

Similarly, the method of forming the source contact hole 41 and the terminal lead-out contact hole 42 also comprises dry etching or any other suitable method.

As an example, the forming of the source lead-out contact hole 43 comprises a first etching stage, a second etching stage, and a third etching stage. The interlayer dielectric layer 4 is etched during the first etching stage under a first etching condition until the masking dielectric layer 3 is exposed, the masking dielectric layer 3 is etched during the second etching stage under a second etching condition until the source lead-out conductive layer 233 is exposed, and the source lead-out conductive layer 233 is etched during the third etching stage under a third etching condition.

As an example, the third etching condition is different from the second etching condition, and is the same as the first etching condition.

As an example, a material of the third dielectric layer 232 is different from the material of the masking dielectric layer 3, so that the etching selectivity ratio between the masking dielectric layer 3 and the third dielectric layer 232 is high.

Specifically, when forming the source lead-out contact hole 43, the masking dielectric layer 3 and the third dielectric layer 232 are etched by using dry etching, to achieve the high etching selectivity ratio. After the etching of the masking dielectric layer 3 is completed, the masking dielectric layer 3 is used as a mask layer to prevent further enlargement of openings in the masking dielectric layer 3. This precaution ensures that the third dielectric layer 232 remains intact, avoiding damage and potential performance issues in the device.

Specifically, after forming the source contact hole 41 and before forming the source conductive layer 5, a source contact region (not shown) of the second doping type is formed in the body region 24.

Specifically, a doping concentration of the source contact region is higher than a doping concentration of the body region 24, so that the source conductive layer 5 filling the source contact hole 41 forms an ohmic contact with the body region 24, resulting a reduced contact resistance.

Specifically, after forming the source contact region and before forming the source conductive layer 5, the third photoresist layer 44 is removed.

Figure 11:
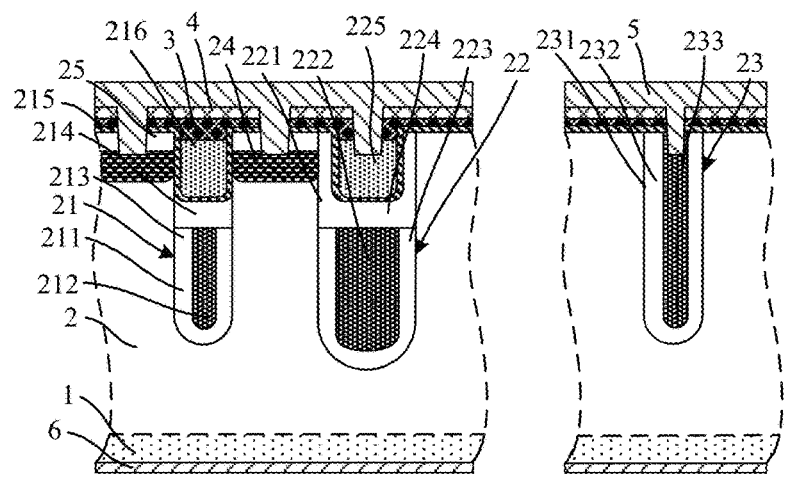
FIG. 11 shows a schematic cross-sectional diagram of the SGT MOSFET according to the present disclosure.

FIG. 11 shows a process of step S5. S5 includes forming the source conductive layer 5 on the upper surface of the interlayer dielectric layer 4, wherein the source conductive layer 5 fills the source lead-out contact hole 43.

Specifically, the source conductive layer 5 also fills the source contact hole 41 and the terminal lead-out contact hole 42.

As an example, the method of forming the source conductive layer 5 comprises magnetron sputtering, physical vapor deposition, chemical vapor deposition, atomic layer deposition, or any other suitable method.

As an example, a thickness of the source conductive layer 5 can be adjusted based on actual applications.

As an example, a gate contact hole (not shown) is further formed in the interlayer dielectric layer 4, a gate layer (not shown) is further formed to fill the gate contact hole, and a drain conductive layer 6 is further formed on a lower surface of the substrate 1.

The gate contact hole and the gate layer may be formed by conventional processes.

As an example, the method of forming the drain conductive layer 6 comprises magnetron sputtering, physical vapor deposition, chemical vapor deposition, atomic layer deposition, or any other suitable method.

According to the method for manufacturing the SGT MOSFET of the present disclosure, after forming the source lead-out structure 23 and before forming the interlayer dielectric layer 4, the masking dielectric layer 3 is formed on the upper surface of the epitaxial layer 2 to cover the upper surface of the epitaxial layer, and the etching selectivity ratio between the masking dielectric layer 3 and the third dielectric layer 232 is high, preventing the source lead-out conductive layer 233 from being etched during the etching of the masking dielectric layer 3. The openings of the masking dielectric layer 3 remain unchanged during the etching of the source lead-out conductive layer 233. The masking dielectric layer 3 is used to mask the third dielectric layer 232, preventing the enlargement of the bottom of the source lead-out contact hole 43 during the etching of the source lead-out conductive layer 233, thereby ensuring that the third dielectric layer 232 remains intact. After forming the interlayer dielectric layer 4, the interlayer dielectric layer 4 is planarized to avoid any shift caused by the uneven surface of the interlayer dielectric layer 4 during photolithography exposure. As a result, it minimizes damage to the third dielectric layer 232 due to contact hole position shifts during the formation of the source lead-out contact hole 43. Additionally, it avoids forming sharp wedges due to insufficient contact area between the source lead-out conductive layer 233 and the source conductive layer 5 filling the source lead-out contact hole 43, which could lead to current concentration during conduction, potentially affecting the device's reliability.

Embodiment 2

Embodiment 2 provides an SGT MOSFET. FIG. 11 shows a schematic cross-sectional diagram of the SGT MOSFET. The SGT MOSFET comprises a substrate 1, an epitaxial layer 2, a masking dielectric layer 3, an interlayer dielectric layer 4, a source lead-out contact hole 43, and a source conductive layer 5. The substrate 1 is of a first doping type. The epitaxial layer 2 is disposed on an upper surface of the substrate 1, and the epitaxial layer 2 comprises a cellular trench structure 21, a terminal lead-out structure 22, a source lead-out structure 23, a body region 24, and a source region 25. The epitaxial layer 2 and the source region 25 are of the first doping type, and the body region 24 is of a second doping type. The source lead-out structure 23 comprises a source lead-out conductive layer 233, the body region 24 is disposed in upper surface layers of the epitaxial layer 2 between two adjacent cellular trench structures 21 and between the cellular trench structure 21 and the terminal lead-out structure 22, and the source region 25 is disposed on an upper surface layer of the body region 24. The masking dielectric layer 3 is disposed above the epitaxial layer 2. The interlayer dielectric layer 4 is planarized and is disposed on an upper surface of the masking dielectric layer 3. The source lead-out contact hole 43 penetrates the interlayer dielectric layer 4 and the masking dielectric layer 3 and extends into the source lead-out conductive layer 233. The source conductive layer 5 is disposed on an upper surface of the interlayer dielectric layer 4 and fills the source lead-out contact hole 43.

As an example, the cellular trench structure 21 comprises a first trench 211, a first shield gate layer 212, a first dielectric layer 213, a first isolation dielectric layer 214, a gate dielectric layer 215, and a first gate conductive layer 216. The first shield gate layer 212 fills a lower portion of the first trench 211, the first dielectric layer 213 wraps a bottom surface and a side wall of the first shield gate layer 212 and is disposed on an inner wall of the first trench 211, the first isolation dielectric layer 214 covers upper surfaces of the first shield gate layer 212 and the first dielectric layer 213, the gate dielectric layer 215 is disposed on the inner wall of the first trench 211 and covers an upper surface of the first isolation dielectric layer 214, and the first gate conductive layer 216 fills an upper portion of the first trench 211. The terminal lead-out structure 22 comprises a second trench 221, a second shield gate layer 222, a second dielectric layer 223, a second isolation dielectric layer 224, the gate dielectric layer 215, and a second gate conductive layer 225. The second shield gate layer 222 fills a lower portion of the second trench 221, the second dielectric layer 223 wraps a bottom surface and a side wall of the second shield gate layer 222 and is disposed on an inner wall of the second trench 221, the second isolation dielectric layer 224 covers upper surfaces of the second shield gate layer 222 and the second dielectric layer 223, the gate dielectric layer 215 is disposed on the inner wall of the second trench 221 and covers an upper surface of the second isolation dielectric layer 224, and the second gate conductive layer 225 fills an upper portion of the second trench 221. The source lead-out structure 23 comprises a third trench 231 and a third dielectric layer 232. The third dielectric layer 232 is disposed on an inner wall of the third trench 231, the source lead-out conductive layer 233 fills the third trench 231, and the gate dielectric layer 215 also covers an upper surface of the epitaxial layer 2.

Specifically, the SGT MOSFET is manufactured by the method described in Embodiment 1.

Specifically, a thickness of the substrate 1 can be adjusted based on actual applications.

Similarly, a thickness of the epitaxial layer 2 can also be adjusted based on actual applications.

Specifically, the masking dielectric layer 3 is in direct contact with the gate dielectric layer 215 disposed above the epitaxial layer 2.

Specifically, the masking dielectric layer 3 is in direct contact with the first gate conductive layer 216 filled into the upper portion of the first trench 211 and the second gate conductive layer 225 filled into the upper portion of the second trench 221.

Specifically, a thickness of the masking dielectric layer 3 can be adjusted based on actual applications as long as the final device is safe for operations. Similarly, a thickness of the interlayer dielectric layer 4 can also be adjusted based on actual applications.

Specifically, an etching selectivity ratio between the masking dielectric layer 3 and the third dielectric layer 232 is high.

Specifically, doping concentrations of the body region 24 and the source region 25 can be selected according to actual applications.

Specifically, the interlayer dielectric layer 4 is further provided with a source contact hole 41 and a terminal lead-out contact hole 42. The source contact hole 41 penetrates the interlayer dielectric layer 4 and the masking dielectric layer 3 and extends into the body region 24, and the terminal lead-out contact hole 42 penetrates the interlayer dielectric layer 4 and the masking dielectric layer 3 and extends into the second gate conductive layer 225.

Specifically, an opening size of each of the source contact hole 41, the terminal lead-out contact hole 42, and the source lead-out contact hole 43 can be determined based on actual applications.

Specifically, a material of the source conductive layer 5 comprises at least one of copper, aluminum, nickel, gold, tungsten, silver, and titanium, or may be any other suitable conductive material. In Embodiment 2, the source conductive layer 5 is made of AlCu.

Specifically, the masking dielectric layer 3 is configured to prevent the enlargement of the bottom of the source lead-out contact hole 43 during the etching of the source lead-out conductive layer 233, thereby ensuring that the third dielectric layer 232 in the source lead-out structure 23 remains intact.

Specifically, the SGT MOSFET further comprises a gate layer and a drain conductive layer 6. The gate layer penetrates the interlayer dielectric layer 4 and the masking dielectric layer 3 and extends into the first gate conductive layer 216. The drain conductive layer 6 is disposed on a lower surface of the substrate 1.

According to the SGT MOSFET of the present disclosure, the masking dielectric layer 3 has a high etching selectivity ratio with respect to the third dielectric layer 232 and the interlayer dielectric layer 4, and is disposed between the epitaxial layer 2 and the interlayer dielectric layer 4, so as to prevent the bottom of the source lead-out contact hole 43 from being too large to damage the third dielectric layer 232.

In summary, by planarizing the upper surface of the interlayer dielectric layer, the SGT MOSFET and its manufacturing method avoid any shift caused by the uneven surface of the interlayer dielectric layer during photolithography exposure. As a result, it minimizes damage to the third dielectric layer due to contact hole position shifts during the formation of the source lead-out contact hole. Additionally, it avoids forming sharp wedges due to insufficient contact area between the source lead-out conductive layer and the source conductive layer filling the source lead-out contact hole, which could lead to current concentration during conduction, potentially affecting the device's reliability. The masking dielectric layer has a high etching selectivity ratio with respect to the third dielectric layer, and is formed between the interlayer dielectric layer and the epitaxial layer, ensuring that the opening size of the masking dielectric layer remains constant during the etching of the source lead-out conductive layer. The masking dielectric layer masks the third dielectric layer to prevent damage, ensures device stability and maintains a high yield for contact holes, all without requiring complex processes or highly precise equipment. Therefore, the present disclosure effectively overcomes various shortcomings of the prior art and has a high industrial value.

The above-mentioned embodiments are merely illustrative of the principle and effects of the present disclosure instead of restricting the scope of the present disclosure. Any person skilled in the art may modify or change the above embodiments without violating the principle of the present disclosure. Therefore, all equivalent modifications or changes made by those who have common knowledge in the art without departing from the spirit and technical concept disclosed by the present disclosure shall be still covered by the claims of the present disclosure.

The invention claimed is:

1. A method for manufacturing a shielded-gate-trench (SGT) MOSFET, comprising:
    providing a substrate, and forming an epitaxial layer on an upper surface of the substrate, wherein the substrate and the epitaxial layer are of a first doping type;
    forming a cellular trench structure, a terminal lead-out structure, a source lead-out structure, a body region, and a source region in the epitaxial layer, wherein the body region is of a second doping type, and the source region is of the first doping type; wherein the source lead-out structure comprises a source lead-out conductive layer, the body region is disposed in upper surface layers of the epitaxial layer between two adjacent cellular trench structures and between the cellular trench structure and the terminal lead-out structure, and the source region is disposed on an upper surface layer of the body region;
    forming a masking dielectric layer disposed above the epitaxial layer and an interlayer dielectric layer covering an upper surface of the masking dielectric layer, and planarizing an upper surface of the interlayer dielectric layer;
    forming a source lead-out contact hole penetrating the interlayer dielectric layer and the masking dielectric layer, and a bottom of the source lead-out contact hole extends into the source lead-out conductive layer;
    forming a source conductive layer on the upper surface of the interlayer dielectric layer, and the source conductive layer also fills the source lead-out contact hole.

2. The method according to claim 1, wherein the cellular trench structure comprises a first trench, a first shield gate layer, a first dielectric layer, a first isolation dielectric layer, a gate dielectric layer, and a first gate conductive layer, wherein the first shield gate layer fills a lower portion of the first trench, the first dielectric layer wraps a bottom surface and a side wall of the first shield gate layer and is disposed on an inner wall of the first trench, the first isolation dielectric layer covers upper surfaces of the first shield gate layer and the first dielectric layer, the gate dielectric layer is disposed on the inner wall of the first trench and covers an upper surface of the first isolation dielectric layer, and the first gate conductive layer fills an upper portion of the first trench; the terminal lead-out structure comprises a second trench, a second shield gate layer, a second dielectric layer, a second isolation dielectric layer, the gate dielectric layer, and a second gate conductive layer, wherein the second shield gate layer fills a lower portion of the second trench, the second dielectric layer wraps a bottom surface and a side wall of the second shield gate layer and is disposed on an inner wall of the second trench, the second isolation dielectric layer covers upper surfaces of the second shield gate layer and the second dielectric layer, the gate dielectric layer is disposed on the inner wall of the second trench and covers an upper surface of the second isolation dielectric layer, and the second gate conductive layer fills an upper portion of the second trench; the source lead-out structure comprises a third trench and a third dielectric layer, wherein the third dielectric layer is disposed on an inner wall of the third trench, the source lead-out conductive layer fills the third trench, and the gate dielectric layer also covers an upper surface of the epitaxial layer.

3. The method according to claim 2, wherein the first isolation dielectric layer and the second isolation dielectric layer are formed by: forming an isolation dielectric material layer on the upper surface of the epitaxial layer, wherein the isolation dielectric material layer fills the first trench and the second trench, and planarizing an upper surface of the isolation dielectric material layer; forming an opening part with a first preset depth in the isolation dielectric material layer, wherein a bottom surface of the opening part is lower than the upper surface of the epitaxial layer; removing the isolation dielectric material layer on the upper surface of the epitaxial layer, and deepening a bottom of the opening part to a second preset depth to obtain the first isolation dielectric layer and the second isolation dielectric layer, wherein an opening size of the opening part is the same as an opening size of the first trench.

4. The method according to claim 2, wherein a source contact hole and a terminal lead-out contact hole are further formed at the same time as the source lead-out contact hole, the source contact hole penetrates the interlayer dielectric layer and the masking dielectric layer and extends into the body region, and the terminal lead-out contact hole penetrates the interlayer dielectric layer and the masking dielectric layer and extends into the second gate conductive layer.

5. The method according to claim 2, wherein a material of the third dielectric layer is different from a material of the masking dielectric layer.

6. The method according to claim 1, wherein a material of the masking dielectric layer comprises silicon nitride.

7. The method according to claim 1, wherein the planarizing of the interlayer dielectric layer adopts chemical mechanical polishing.

8. The method according to claim 1, wherein the source lead-out contact hole is formed by dry etching.

9. The method according to claim 1, wherein the forming of the source lead-out contact hole comprises a first etching stage, a second etching stage, and a third etching stage, wherein the interlayer dielectric layer is etched during the first etching stage under a first etching condition until the masking dielectric layer is exposed, the masking dielectric layer is etched during the second etching stage under a second etching condition until the source lead-out conductive layer is exposed, and the source lead-out conductive layer is etched during the third etching stage under a third etching condition.

10. The method according to claim 9, wherein the second etching condition is different from the third etching condition.

11. An SGT MOSFET, comprising:
a substrate of a first doping type;
an epitaxial layer disposed on an upper surface of the substrate, wherein the epitaxial layer comprises a cellular trench structure, a terminal lead-out structure, a source lead-out structure, a body region, and a source region, wherein the epitaxial layer and the source region are of the first doping type, and the body region is of a second doping type; wherein the source lead-out structure comprises a source lead-out conductive layer, the body region is disposed in upper surface layers of the epitaxial layer between two adjacent cellular trench structures and between the cellular trench structure and the terminal lead-out structure, and the source region is disposed on an upper surface layer of the body region;
a masking dielectric layer disposed above the epitaxial layer;
an interlayer dielectric layer, planarized and disposed on an upper surface of the masking dielectric layer;
a source lead-out contact hole, penetrating the interlayer dielectric layer and the masking dielectric layer and extending into the source lead-out conductive layer; and
a source conductive layer, disposed on an upper surface of the interlayer dielectric layer and filled into the source lead-out contact hole.

12. The SGT MOSFET according to claim 11, wherein the cellular trench structure comprises a first trench, a first shield gate layer, a first dielectric layer, a first isolation dielectric layer, a gate dielectric layer, and a first gate conductive layer, wherein the first shield gate layer fills a lower portion of the first trench, the first dielectric layer wraps a bottom surface and a side wall of the first shield gate layer and is disposed on an inner wall of the first trench, the first isolation dielectric layer covers upper surfaces of the first shield gate layer and the first dielectric layer, the gate dielectric layer is disposed on the inner wall of the first trench and covers an upper surface of the first isolation dielectric layer, and the first gate conductive layer fills an upper portion of the first trench; the terminal lead-out structure comprises a second trench, a second shield gate layer, a second dielectric layer, a second isolation dielectric layer, the gate dielectric layer, and a second gate conductive layer, wherein the second shield gate layer fills a lower portion of the second trench, the second dielectric layer wraps a bottom surface and a side wall of the second shield gate layer and is disposed on an inner wall of the second trench, the second isolation dielectric layer covers upper surfaces of the second shield gate layer and the second dielectric layer, the gate dielectric layer is disposed on the inner wall of the second trench and covers an upper surface of the second isolation dielectric layer, and the second gate conductive layer fills an upper portion of the second trench; the source lead-out structure comprises a third trench and a third dielectric layer, wherein the third dielectric layer is disposed on an inner wall of the third trench, the source lead-out conductive layer fills the third trench, and the gate dielectric layer also covers an upper surface of the epitaxial layer.

13. The SGT MOSFET according to claim 12, wherein the SGT MOSFET further comprises a source contact hole and a terminal lead-out contact hole, wherein the source contact hole penetrates the interlayer dielectric layer and the masking dielectric layer and extends into the body region, and the terminal lead-out contact hole penetrates the interlayer dielectric layer and the masking dielectric layer and extends into the second gate conductive layer.

14. The SGT MOSFET according to claim 12, wherein an etching selectivity ratio between the masking dielectric layer and the third dielectric layer is high.

15. The SGT MOSFET according to claim 12, wherein the SGT MOSFET further comprises a gate layer, and the gate layer penetrates the interlayer dielectric layer and the masking dielectric layer and extends into the first gate conductive layer.

* * * * *